(12) United States Patent
Ruile et al.

(10) Patent No.: US 9,941,858 B2
(45) Date of Patent: Apr. 10, 2018

(54) ELECTRICOACOUSTIC COMPONENT WITH STRUCTURED CONDUCTOR AND DIELECTRIC LAYER

(71) Applicant: Snaptrack Inc., San Diego, CA (US)

(72) Inventors: Werner Ruile, Munich (DE); Markus Hauser, Feldafing (DE); Christoph Eggs, Rattenkirchen (DE); Hans-Peter Kirschner, Rosenheim (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 14/290,705

(22) Filed: May 29, 2014

(65) Prior Publication Data

US 2014/0312736 A1 Oct. 23, 2014

Related U.S. Application Data

(60) Division of application No. 12/861,184, filed on Aug. 23, 2010, now Pat. No. 8,756,796, which is a (Continued)

(30) Foreign Application Priority Data

Apr. 1, 2008 (DE) .................. 10 2008 016 613

(51) Int. Cl.
*H03H 9/25* (2006.01)
*H01L 21/316* (2006.01)
(Continued)

(52) U.S. Cl.
CPC .......... *H03H 9/25* (2013.01); *H01L 21/02244* (2013.01); *H01L 21/31683* (2013.01);
(Continued)

(58) Field of Classification Search
CPC .......... H03H 9/25; H01L 41/00; H01L 41/083
(Continued)

(56) References Cited

U.S. PATENT DOCUMENTS 5,424,920 A 6/1995 Miyake
5,757,250 A 5/1998 Ichikawa et al.
(Continued)

FOREIGN PATENT DOCUMENTS

DE 102005055871 A1 * 5/2007
DE 102006019961 A1 10/2007
(Continued)

OTHER PUBLICATIONS

Carraro, C., et al., • Metallization and Nanostructuring of Semiconductor Surfaces by Galvanic Displacement Processes,• Surface Science Reports, Science Direct, Jun. 8, 2007, pp. 499-525, Elsevier B.V.
(Continued)

*Primary Examiner* — Dean Takaoka
(74) *Attorney, Agent, or Firm* — Patterson & Sheridan, L.L.P

(57) ABSTRACT

An electroacoustic component includes a substrate configured to carry acoustic waves. The electroacoustic component can be a guided bulk acoustic wave (GBAW) device, for example. A structured electric conductive layer is arranged on the substrate and an electrically dielectric layer (for example, aluminum oxide) is also arranged over the substrate.

15 Claims, 7 Drawing Sheets

Related U.S. Application Data continuation of application No. PCT/EP2009/053883, filed on Apr. 1, 2009.

(51) Int. Cl.
*H03H 3/08* (2006.01)
*H03H 9/02* (2006.01)
*H01L 21/02* (2006.01)

(52) U.S. Cl.
CPC ............ *H03H 3/08* (2013.01); *H03H 9/0222* (2013.01); *Y10T 29/4902* (2015.01); *Y10T 29/49002* (2015.01); *Y10T 29/49005* (2015.01); *Y10T 29/4908* (2015.01); *Y10T 29/4913* (2015.01); *Y10T 29/49147* (2015.01)

(58) Field of Classification Search
USPC .......... 333/187, 193, 195; 310/313 R, 313 A
See application file for complete search history.

(56) References Cited

U.S. PATENT DOCUMENTS

| | | | |
|---|---|---|---|
| 5,793,147 A | 8/1998 | Kadota et al. | |
| 6,339,527 B1 | 1/2002 | Farooq et al. | |
| 7,262,676 B2* | 8/2007 | Ruile et al. | ................... 333/193 |
| 7,573,178 B2* | 8/2009 | Inoue | ................ H03H 9/02574 |
| | | | 310/313 R |
| 7,830,067 B2* | 11/2010 | Matsuda | ............. H03H 9/0222 |
| | | | 310/313 C |
| 7,851,977 B2* | 12/2010 | Ruile et al. | ................... 310/334 |
| 7,863,801 B2* | 1/2011 | Kadota | ..................... 310/313 A |
| 7,915,786 B2* | 3/2011 | Matsuda | ............. H03H 9/0222 |
| | | | 310/313 A |
| 7,948,333 B2* | 5/2011 | Ruile | ................... H03H 9/0222 |
| | | | 333/193 |
| 8,085,117 B1* | 12/2011 | Abbott | ................. H03H 9/0222 |
| | | | 310/313 R |
| 8,099,853 B2* | 1/2012 | Kando | ..................... H03H 3/08 |
| | | | 205/122 |
| 8,283,835 B2* | 10/2012 | Metzger et al. | .......... 310/313 A |
| 8,756,796 B2 | 6/2014 | Ruile et al. | |
| 2006/0138902 A1* | 6/2006 | Kando | ..................... H03H 3/08 |
| | | | 310/313 D |
| 2007/0210676 A1* | 9/2007 | Matsuda | ............ H03H 9/02818 |
| | | | 310/326 |
| 2009/0108961 A1 | 4/2009 | Roesler et al. | |
| 2009/0129418 A1* | 5/2009 | Matsumura | ............... H01S 5/22 |
| | | | 372/44.01 |
| 2009/0267449 A1* | 10/2009 | Goto | .................... H03H 9/0222 |
| | | | 310/313 R |
| 2011/0013865 A1 | 1/2011 | Shibata et al. | |

FOREIGN PATENT DOCUMENTS

| | | | | |
|---|---|---|---|---|
| EP | 1635459 A1 * | 3/2006 | | .............. H03H 3/08 |
| EP | 1879291 A1 * | 1/2008 | | .......... H03H 9/0222 |
| JP | 07321598 A | 12/1995 | | |
| JP | 2005142629 A | 6/2005 | | |
| JP | 2007060465 A | 3/2007 | | |
| WO | WO 2007059741 A1 * | 5/2007 | | .............. H03H 3/02 |
| WO | WO 2008087836 A1 * | 7/2008 | | .............. H03H 3/08 |
| WO | WO 2009022410 A1 * | 2/2009 | | .......... H03H 9/0222 |

OTHER PUBLICATIONS

International Search Report and Written Opinion—PCT/EP2009/053883—ISA/EPO—dated Sep. 4, 2009.

\* cited by examiner

ELECTRICOACOUSTIC COMPONENT WITH STRUCTURED CONDUCTOR AND DIELECTRIC LAYER

This application is a divisional of U.S. application Ser. No. 12/861,184, filed on Aug. 23, 2010, which claims the benefit of International Application No. PCT/EP2009/053883, filed Apr. 1, 2009, which claims priority to German Application No. 10 2008 016 613.8, filed on Apr. 1, 2008. All of these applications are hereby incorporated herein by reference.

TECHNICAL FIELD

A method for producing an electric component comprising at least one dielectric layer is specified.

BACKGROUND

A widespread problem involves cost-effectively producing a thick dielectric layer of above 1 µm, for example, on a substrate surface. Such layers have hitherto been produced on substrates by means of vapor deposition processes or sputtering processes, for example. However, both these processes are limited with the deposition rates. The substrate, which can be a wafer, for example, is therefore in the process chamber for a very long time, which makes the process very expensive. This problem occurs, for example, in the manufacture of electroacoustic devices such as, for example, devices which operate with guided bulk acoustic waves (GBAW).

SUMMARY

In one aspect, the invention provides a method by which, during the production of an electric component, thick dielectric layers can be applied on a substrate cost-effectively.

In one method embodiment for producing an electric component comprising a dielectric layer on a substrate, the method comprises applying a metallic layer to the substrate as method step a), oxidizing the metallic layer to form a dielectric layer as method step b), wherein at least one partial region of the metallic layer is fully oxidized through the entire thickness of the layer.

This method constitutes a rapid and cost-effective alternative to the known methods such as vapor deposition or sputtering of the dielectric layers. In the method according to the invention, many substrates can be processed simultaneously in an installation (so-called batch process). An installation suitable for such a method also does not require a vacuum apparatus.

The process control of such a process is also configured more simply than the known processes. Firstly, it is easy to ascertain whether or not the metal layer has been fully oxidized, for example, by means of optical inspection; secondly the process stops automatically when no more material to be oxidized is present.

A further advantage of this method is that the properties of the dielectric layer thus produced can be controlled by means of the process parameters of the oxidation process. Consequently, even after the metallic layer has been applied, the properties of the layer can still be influenced. This is advantageous particularly when the electric components are components which have to be finely adjusted, such as, for example, the trimming of GBAW components, which has been carried out hitherto, for example, by corresponding setting of the layer thickness of the dielectric layer, for example. If the frequency position of the acoustic transducers is measured still prior to oxidation, it is possible to calculate the necessary constitution of the dielectric for attaining the correct frequency position, and then to set up the corresponding process parameters of the oxidation.

In a further method embodiment, the metallic layer is applied by firstly a relatively thin closed base metallization being deposited on the substrate, and then the thin base metallization being thickened with the aid of an electrolytic method.

One advantage of this method embodiment is that a very thick metallic layer can be produced cost-effectively with the aid of the electrolytic method. The costly method such as vapor deposition, for example, is required only for a very thin start layer. A further advantage of this method is that the processes proceed at lower temperatures than in comparison with the conventional deposition methods. As a result, the substrate, which can comprise a piezoelectric and/or pyroelectric material, for example, is subjected to significantly less loading, as a result of which, inter alia, the risk of fracture is reduced. Layers having a thickness of a number of micrometers can be produced with the aid of this method.

A material which comprises aluminum is preferably used for the metallic layer. A material which comprises a proportion of more than 90% of aluminum is preferably used; pure aluminum is particularly preferably used.

Materials which comprise a high proportion of aluminum or metallic aluminum itself have the advantage that they can be thickened very well by means of an electrolytic method and they can also be oxidized well with the aid of an oxidation process. In this case, it is also possible that metallic layers of a number of micrometers can be fully oxidized in their entirety. In this case, these layers can also be applied on a substrate such as, for example, a wafer or glass. In this case, this oxidation process can start at the free surface and then proceeds through as far as the substrate. A further advantage of aluminum is that aluminum or $Al_2O_3$ is very well suited to dielectric layers in electric components, such as, for example, as a dielectric layer in GBAW components. One reason for this is the high propagation speed of the acoustic wave in $Al_2O_3$, which enables a vertical wave-guiding structure. A further reason is the high thermal conductivity of $Al_2O_3$, which has the effect that heat generated dissipatively can be led away well and local heating can thus substantially be avoided.

A further method variant comprises as method step A) providing a substrate for an electroacoustic component, as method step B) applying an electrically conductive layer to the substrate, as method step C) structuring the electrically conductive layer, as method step D) applying an electrically nonconductive layer to the structured conductive layer, as method step E) applying a base metallization to the electrically nonconductive layer, as method step F) thickening the base metallization by means of an electrolytic method, such that a metallic layer arises, and as method step G) oxidizing the metallic layer, such that a dielectric layer arises.

In a further variant, method step D) can also be followed directly by subsequent processing of the electrically nonconductive layer. This can comprise planarizing the layer, but also locally altering the layer thickness for trimming purposes.

Consequently, by applying the method comprising its method steps A) to G), it is possible to produce an electric component comprising the layer sequence of a substrate, structured electrically conductive layer, electrically nonconductive layer, dielectric layer. In this case, it is also conceivable for the electrically nonconductive layer to comprise a metal oxide produced using an oxidation process.

By way of example, an LiNbO$_3$ single-crystal wafer or an LiTaO$_3$ single-crystal wafer can be used for the substrate in method step A).

Applying the electrically conductive layer in method step B) can be performed by means of vapor deposition, for example. For this purpose it is possible to use, for example, a material selected from: Cu, Ag, Au, Pt, Ti or combinations of the elements.

Structuring the electrically conductive layer in method step C) can take place by means of a photographic technique in combination with a lift-off technique, for example.

By way of example, SiO$_2$ or TeO$_2$ can be used for the electrically nonconductive layer in method step D). The electrically nonconductive layer can be applied by means of a sputtering process, for example.

Applying the base metallization in method step E) can be performed by means of a vapor deposition process, for example.

A material whose proportion of aluminum lies above 90% is preferably used for the base metallization and for the metallic layer which is produced by means of the electrolytic method.

A piezoelectric material is preferably used for the substrate in method step A).

A further method variant comprises as an additional method step H) applying a resist to partial regions of the electrically nonconductive layer. This method step is preferably performed between method steps D) and E).

Method step H) makes it possible, firstly, to structure the electrically nonconductive layer; secondly, it is possible to apply a further layer to the electrically nonconductive layer, which, however, only covers partial regions.

A further method variant comprises as an additional method step I) structuring the electrically nonconductive layer. This method step is preferably performed after method step G). Method step I) makes it possible, for example, that a through-plating to regions of the electrically conductive layer, which is now uncovered again, can be performed. The dielectric layer produced in method step G) can serve as a mask in this case.

A further method variant comprises as an additional method step J) applying a resist to the surface. This method step J) is preferably performed after method step G). Method step J) is particularly preferably performed after method step I). If, by way of example, regions of the electrically conductive layer were uncovered in method step I), then after the resist has been applied, a further layer can be applied to partial regions of the surface.

A further method variant comprises as an additional method step K) applying a contact layer to the surface. This method step K) is preferably performed after method step J). In a further method step L), the resist and the contact layer deposited thereon can then be removed. The contact layer remains on the regions which were not covered with the resist previously. The contact layer can be in electrical contact with the electrically conductive layer, for example, and can serve for subsequently making contact with the component, for example.

A further method variant comprises as an additional method step M) depositing an electrically insulating covering layer on the surface. This can serve not only for electrical insulation but furthermore also for protecting the component against environmental influences, for example.

In a further method variant, the method comprises as an additional method step N) structuring the electrically nonconductive layer. This method step is preferably performed between method steps D) and E). By way of example, regions of the structured electrically conductive layer can thereby be uncovered again. By virtue of the fact that method step N) is performed before method step F), the base metallization is also applied to the uncovered region. By way of example, regions of the electrically conductive layer can be involved in this case.

A further method variant comprises as an additional method step O) applying a resist to partial regions of the metallic layer. This method step is preferably performed between method steps F) and G). In a further method step P), the metallic layer can then be etched. This can be performed by means of wet-chemical etching, for example. The metallic layer can thereby be structured. If method step P) is performed before method step G), the layer is structured before it is oxidized.

A further method variant comprises as an additional method step Q) applying an oxidation resist to the metallic layer. This method step is preferably performed after method step F). In a further method step R), the metallic layer can then be selectively oxidized. In connection with the present invention, selective oxidation should be understood to mean that partial regions of the metallic layer which were previously protected by an oxidation resist, for example, are not oxidized, whereas other, non-protected regions are completely oxidized. In connection with the present invention, complete oxidation should be understood to mean that a layer is oxidized in its entire thickness. This method variant makes it possible to generate a layer which comprises both oxidized and metallic regions. The metallic regions can subsequently be used for the purpose of electrical conduction, for example.

A further method variant comprises the following method steps after method step R): removing the oxidation resist, applying a resist, depositing a contact layer on the surface, removing the resist with the contact layer deposited thereon, and also applying an electrically insulating covering layer on the surface. As a result of the sequence of these method steps it is possible to produce a finished component which comprises the layer sequences of a substrate, structured electrically conductive layer, electrically nonconductive layer, dielectric layer and electrically insulating covering layer, and also has the necessary electrical contacts in the form of the corresponding contact layers.

A further method variant comprises the following method steps after method step R): removing the oxidation resist and applying a contact layer to the region uncovered by the removal of the oxidation resist. The component can now be connected to a circuit board, for example, via the contact layer ("flip-chip"). However, it is also possible for the component now to be connected to a further component in which electrically conductive regions were likewise uncovered by removal of the oxidation resist ("stacking").

In a further method variant, a portion of the surface of the substrate can be removed after method step G). The surface lying opposite the surface which was coated with the electrically conductive layer is removed in this case. The thickness of the substrate can thereby be adapted to a desired value. The thickness of the substrate can be set, for example, to the same thickness as that of the dielectric layer.

In addition to the method for producing an electric component comprising a dielectric layer, an electroacoustic component comprising a dielectric layer is also specified.

Such an electroacoustic component can be produced according to one of the methods described above, for example.

The component can be, for example, a component which operates with guided bulk acoustic waves (GBAW component). In the case of such a component, by way of example, the electrically conductive layer can comprise one of the following elements: Cu, Ag, Au, Pt, Ti. The substrate of the electroacoustic component can comprise $LiNbO_3$ or $LiTaO_3$, for example. The electrical nonconductive layer of the component can comprise $SiO_2$ or $TeO_2$, for example.

A layer of the electroacoustic component can have, for example, regions comprising $Al_2O_3$. However, the layer can also have regions comprising metallic Al. These metallic Al regions can be in electrical contact with the electrically conductive layer, for example. Consequently, a layer of the component can comprise the metallic layer in partial regions and the dielectric layer in other partial regions.

BRIEF DESCRIPTION OF THE DRAWINGS

Specific embodiments of the invention will be explained in greater detail below with reference to the figures.

In the figures.

DETAILED DESCRIPTION OF ILLUSTRATIVE EMBODIMENTS

FIG. 1 shows a schematic illustration of an embodiment of the electric component. This component comprises a substrate 1, a structured electric conductive layer 2 arranged thereon and also an electrically nonconductive layer 3 arranged thereon. Such an electric component is obtained by means of the following method steps, for example: providing an electric substrate 1, applying an electrically conductive layer 2 to the substrate, structuring the electrically conductive layer 2, and applying an electrically nonconductive layer 3 to the structured conductive layer 2.

In this case, the electrically conductive layer 2 can be structured to form an electroacoustic transducer. The transducer can have, for example, comb-like electrodes that intermesh. In this case, each electrode can have electrode fingers which are realized as strip-type structures of the electrically conductive layer and which extend perpendicularly to the wave propagation direction. The electrically conductive layer 2 can furthermore have acoustic reflectors, for example. In this case, each reflector can have at least one strip, for example. The width of the strip is preferably approximately ¼ wavelength. In the case of a plurality of strips, the distance between the strips can likewise be ¼ wavelength. The transducer can be shaped such that it is suitable for unidirectional and for bi-directional emission of an acoustic wave. The materials are preferably chosen such that the propagation speed of an acoustic wave is lower in the electrically nonconductive layer 3 than in the adjoining layers.

Figure 1A:
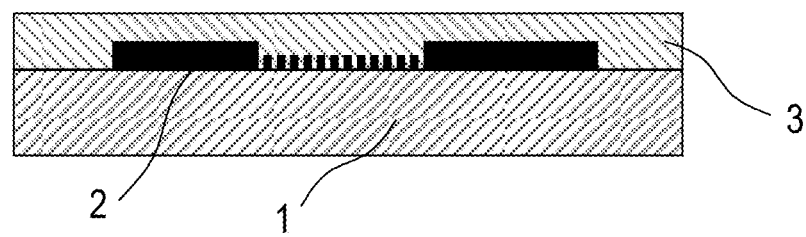
FIGS. 1a to 1g show schematic illustrations of an electric component in different method stages.
Figure 1B:
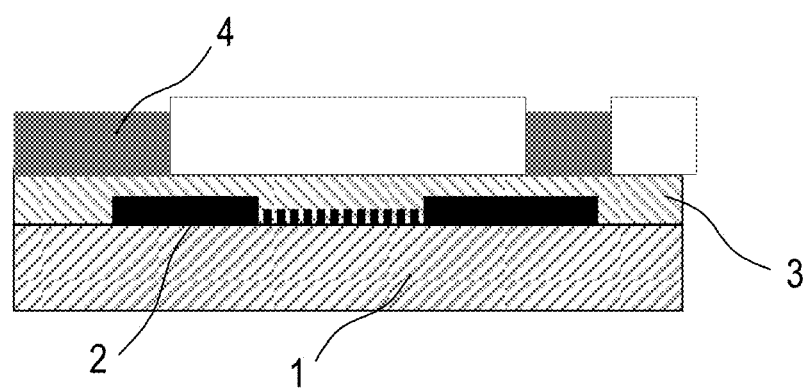

FIG. 1b shows an embodiment of the electric component, which could arise from the component illustrated in FIG. 1a by virtue of a resist 4 being applied to partial regions of the electrically nonconductive layer 3.

Figure 1C:
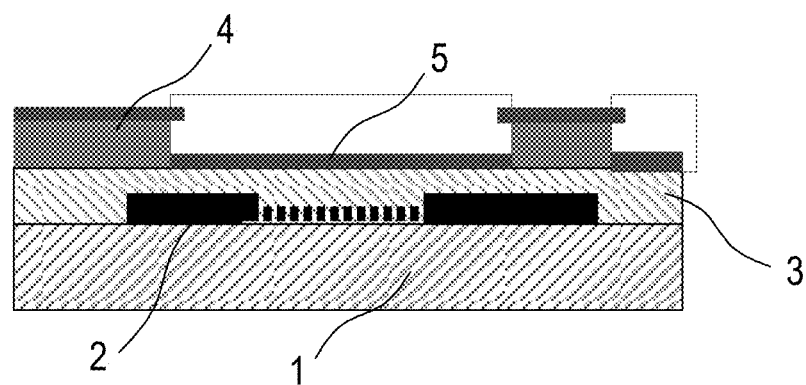

FIG. 1c shows the schematic illustration of an embodiment of the electrical component, which could arise from a component illustrated in FIG. 1b. In order to arrive at the component illustrated in FIG. 1c, yet another method step can be performed, applying a base metallization 5.

Figure 1D:
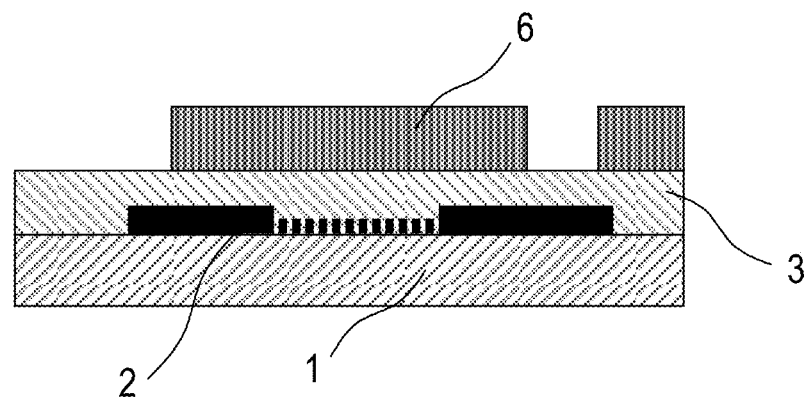

The embodiment of the electric component as illustrated schematically in FIG. 1d could arise, for example, from the component illustrated in FIG. 1c. For this purpose, in one method step, the resist 4 with the base metallization 5 deposited thereon can be removed again. Furthermore, the base metallization can be thickened to form a thick metal layer with the aid of an electrolytic method, for example. The metallic layer 6 could result from this.

Figure 1E:
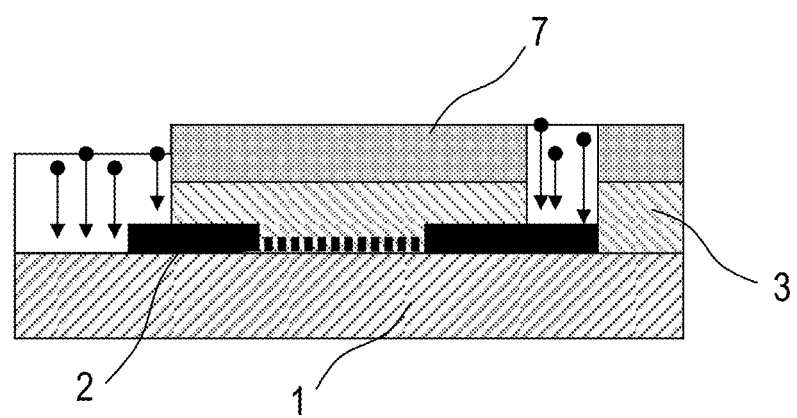

FIG. 1e shows the schematic illustration of an embodiment of the electric component, which could arise for example from the component illustrated in FIG. 1d. For this purpose, the metallic layer 6 can be oxidized to form the dielectric layer. In a further method step, the electrically nonconductive layer 3 can now be structured with the aid of an etching method. The etching is illustrated schematically by arrows in FIG. 1e. One possible etching method would be reactive ion etching, for example. The dielectric layer 7 can serve as a mask during the etching process. By way of example, partial regions of the structured electrically conductive layer 2 can be uncovered by the etching process.

Figure 1F:
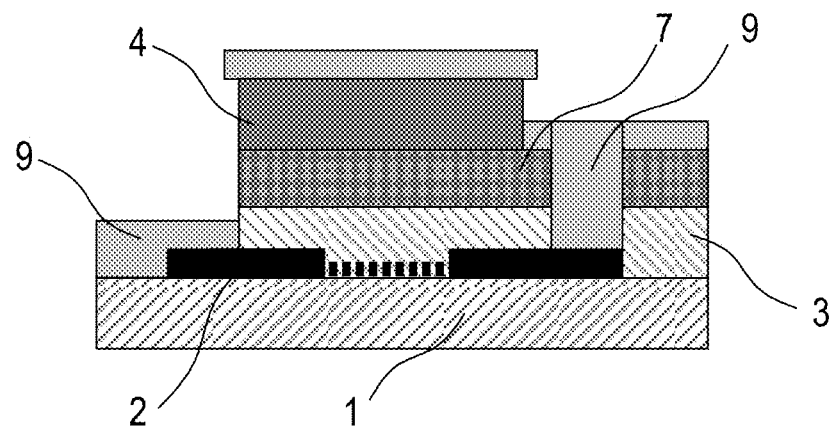

FIG. 1f schematically illustrates an embodiment of the electric component, which could arise, for example, from the component illustrated in FIG. 1e. For this purpose, a resist 4 can be applied on a partial region of the dielectric layer 7. Afterward, a contact layer 9 can be applied on the surface of the component. The contact layer 9 can serve for subsequently making electrical contact with the component.

Figure 1G:
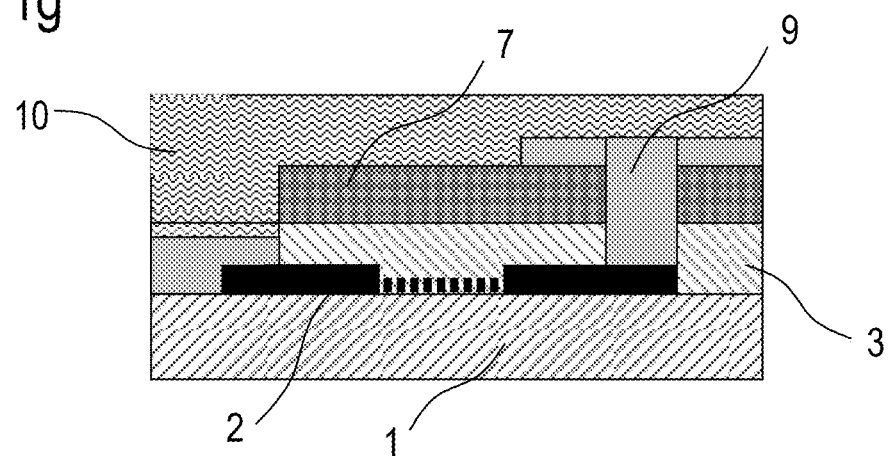

FIG. 1g schematically illustrates an embodiment of a component, which could arise, for example, from the component illustrated in FIG. 1f. For this purpose, the resist layer 4 with the contact layer deposited thereon can be removed. In a further method step, an electrically insulating covering layer 10 can be applied on the component.

Figure 2A:
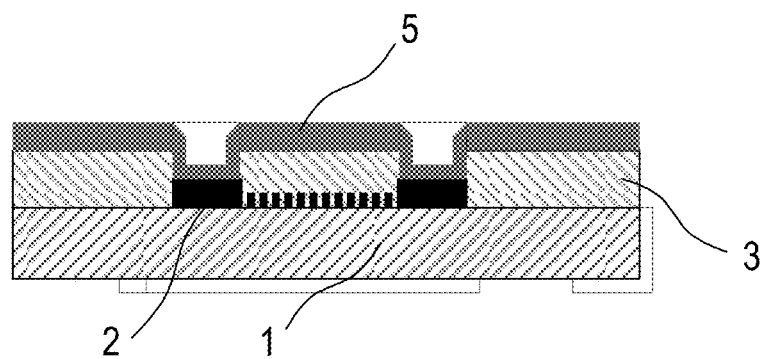
FIGS. 2a to 2i show schematic illustrations of a further electric component in different method stages.

FIG. 2a schematically illustrates an embodiment of the electric component, which could arise, for example, from a component as illustrated in FIG. 1a. For this purpose, the electrically nonconductive layer 3 can be structured. In a further method step, a base metallization 5 can then be applied to the structured surface.

Figure 2B:
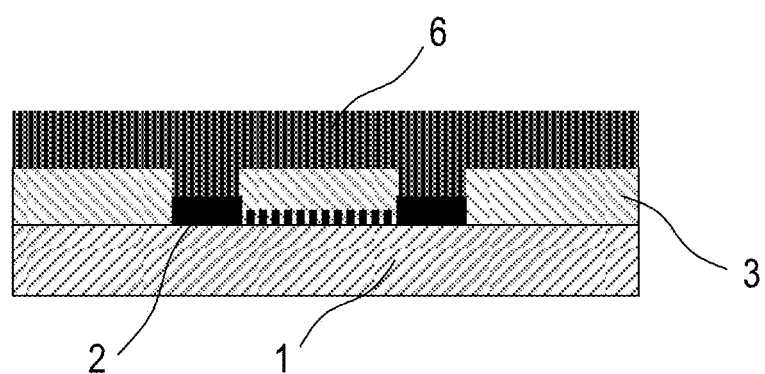

FIG. 2b schematically illustrates an embodiment of the electric component, which could arise from a component as illustrated in FIG. 2a. For this purpose, the base metallization 5 illustrated in FIG. 2a can be thickened to form a metallic layer 6. This can be done with the aid of an electrolytic method, for example.

Figure 2C:
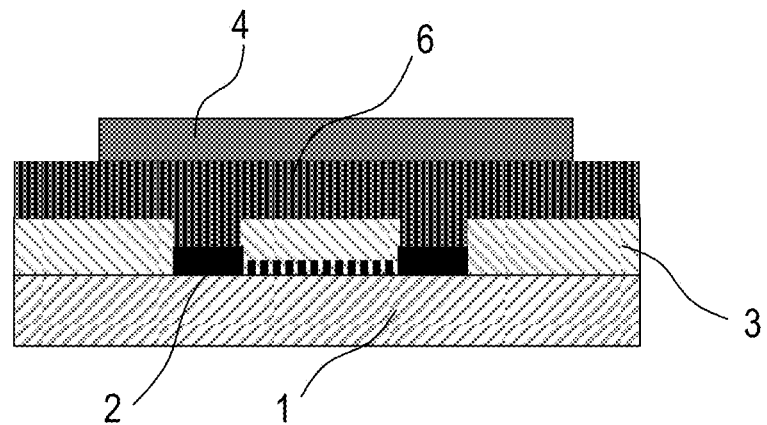

The embodiment of the electric component as illustrated schematically in FIG. 2c can arise, for example, from the component illustrated in FIG. 2b by means of a resist 4 being applied to a partial region of the metallic layer 6.

The embodiment of the electric component as illustrated schematically in FIG. 2d can arise, for example, from the electric component illustrated in FIG. 2c by means of the metallic layer 6 being etched and the resist 4 subsequently being removed.

Figure 2D:
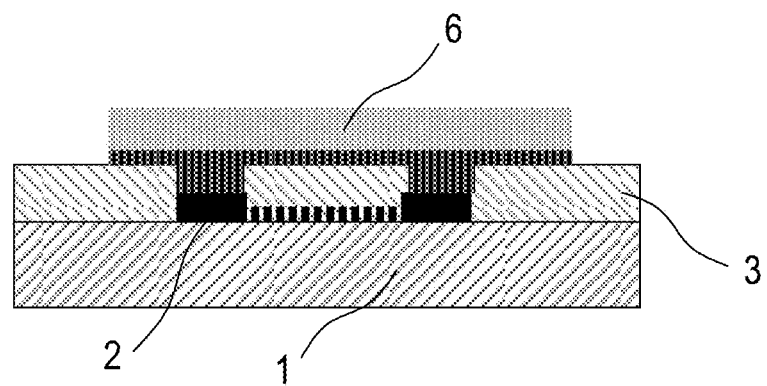
Figure 2E:
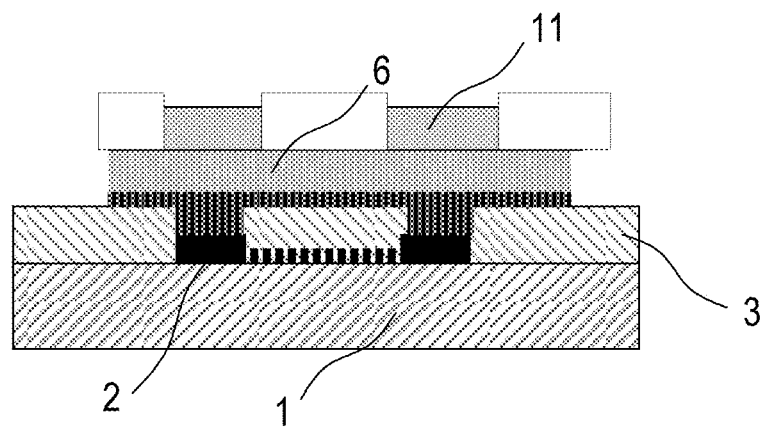

The embodiment of the electric component as illustrated schematically in FIG. 2e can arise, for example, from the electric component illustrated in FIG. 2d by means of an oxidation resist 11 being applied to a partial region of the metallic layer 6.

Figure 2F:
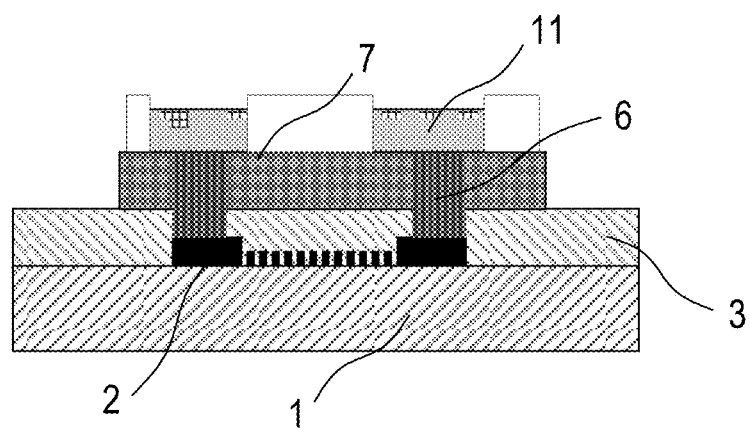

The embodiment of the electric component as illustrated schematically in FIG. 2f can arise, for example, from an electric component as illustrated in FIG. 2e. For this purpose, the metallic layer 6 is selectively oxidized. This means that the partial regions which are not protected by an oxidation resist, for example, are fully oxidized in their entirety, whereas the partial regions which are protected by an oxidation resist, for example, remain as metallic regions. Consequently, a layer of the component can comprise the metallic layer 6 in partial regions and the dielectric layer 7 in other partial regions.

Figure 2G:
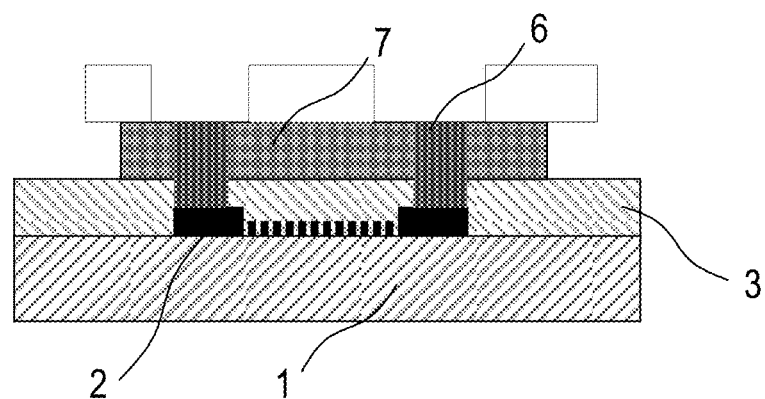

The embodiment of the electric component as illustrated schematically in FIG. 2g can arise, for example, from the component illustrated in FIG. 2f by means of the oxidation resist 11 being removed. However, the electrolytically thickened, thick metallic layer present before the oxidation need not already be structured, as in FIG. 2g, but rather can appear as in FIG. 2b. The then continuous metallic layer 6 can then be selectively oxidized, as described in FIG. 2f.

Figure 2H:
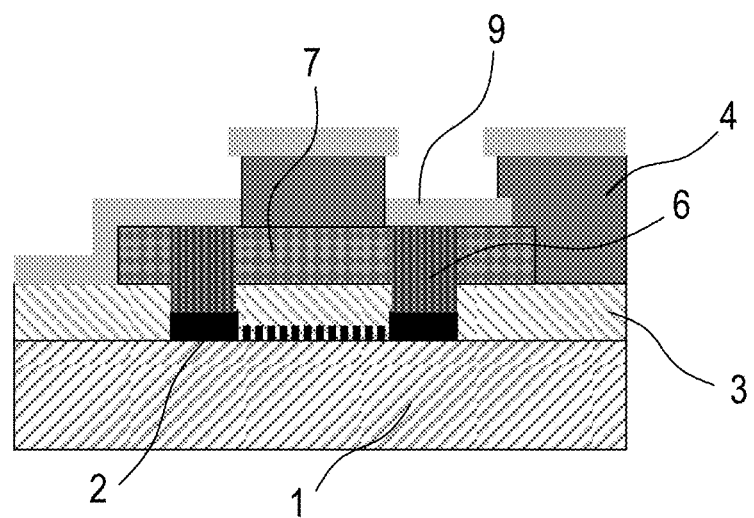

The embodiment of the electric component as illustrated schematically in FIG. 2h can arise, for example, from the electric component illustrated in FIG. 2g by virtue of the fact that, in a first method step, a resist 4 is applied to partial regions of the surface of the electric component, and, in a further method step, a contact layer 9 is deposited onto the surface of the electric component.

Figure 2I:
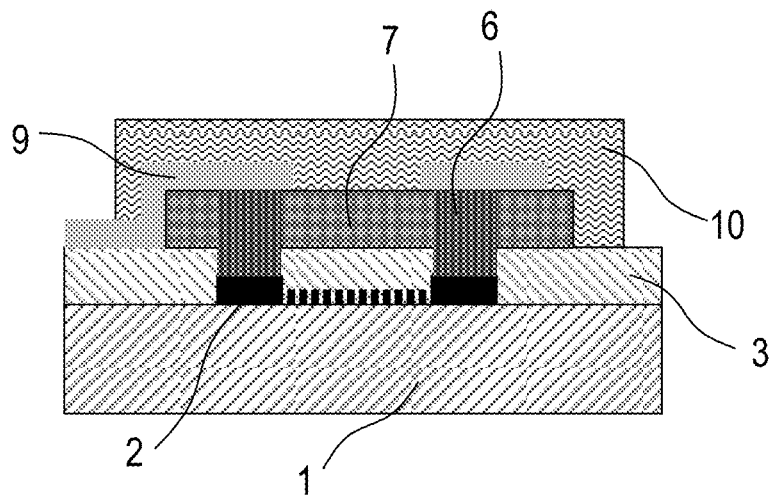

The embodiment of the electric component as illustrated schematically in FIG. 2i can arise, for example, from the electric component illustrated in FIG. 2h. For this purpose, the resist 4 and the contact layer 9 deposited on the resist would be removed. In a further method step, an electrically insulating covering layer 10 is applied to a partial region of the surface of the electric component.

Figure 3A:
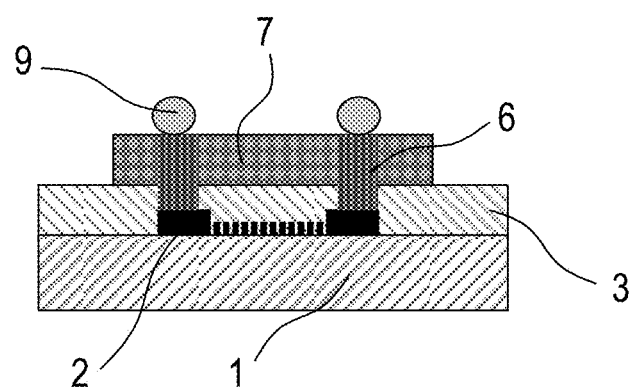
FIGS. 3a to 3c show schematic illustrations of different embodiment variants of the electrical component.

The embodiment of the electric component as illustrated schematically in FIG. 3a can arise, for example, from the electric component illustrated in FIG. 2g by means of a contact layer 9 being deposited onto the uncovered surface of the metallic layer 6.

Figure 3B:
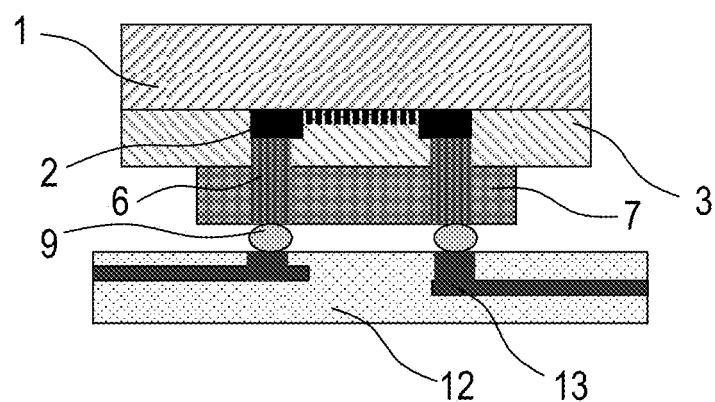

The embodiment of the electric component as illustrated in schematically in FIG. 3b can arise, for example, from the electric component illustrated schematically in FIG. 3a. For this purpose, the electric component illustrated in FIG. 3a is applied to a circuit board 12. In this case, by way of example, the contact layer 9 is in electrically conductive contact with the conductor tracks 13 of the circuit board 12.

Figure 3C:
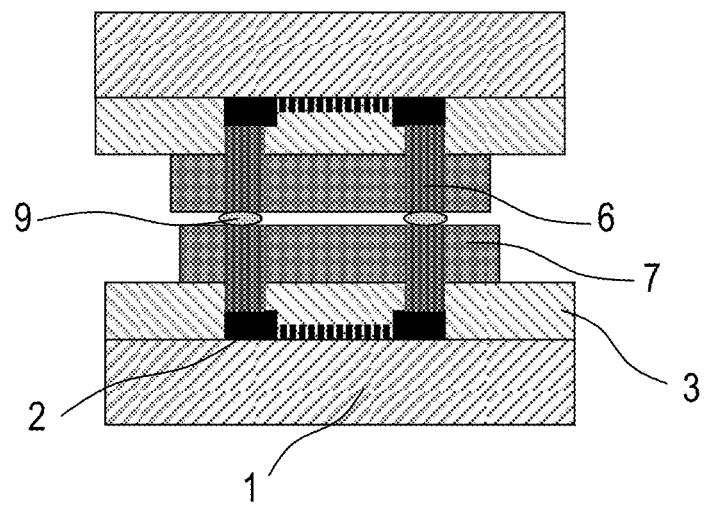

The embodiment of the electric component as illustrated schematically in FIG. 3c can arise, for example, by a combination of the components as illustrated in FIG. 2g and FIG. 3a. For this purpose, the two components are joined together such that the contact layer 9 of the component illustrated in FIG. 3a comes into electrically conductive contact with the uncovered surface of the metallic layer 6 of the component illustrated in FIG. 2g. As a result, the structured electrically conductive layers 2 of the two previously separate components can now be electrically conductively connected.

Figure 4:
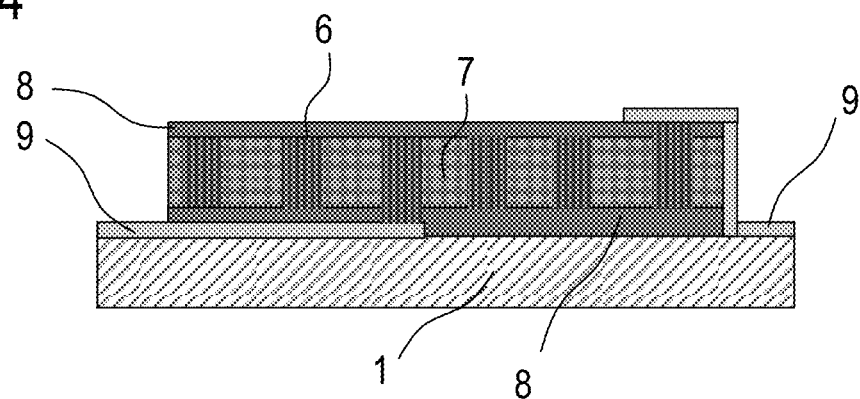
FIG. 4 shows a schematic illustration of an embodiment of the electric component.

FIG. 4 shows the schematic illustration of an embodiment of an electric component. The latter comprises a substrate 1, on the edge regions of which contact layers 9 for making electrical contact are deposited. Furthermore, the component comprises two passivation layers 8. The passivation layer 8 can comprise $Si_3N_4$ for example. Arranged between the two passivation layers 8 is a layer with a sequence of metallic layers 6 and dielectric layers 7. By way of example, coils can be defined by means of such a sequence of correspondingly structured layers. In this case, one of the metallic layers 6 can be electrically conductively connected to one contact layer 9, and a further metallic layer 6 can be electrically conductively connected to another contact layer 9.

Figure 5:
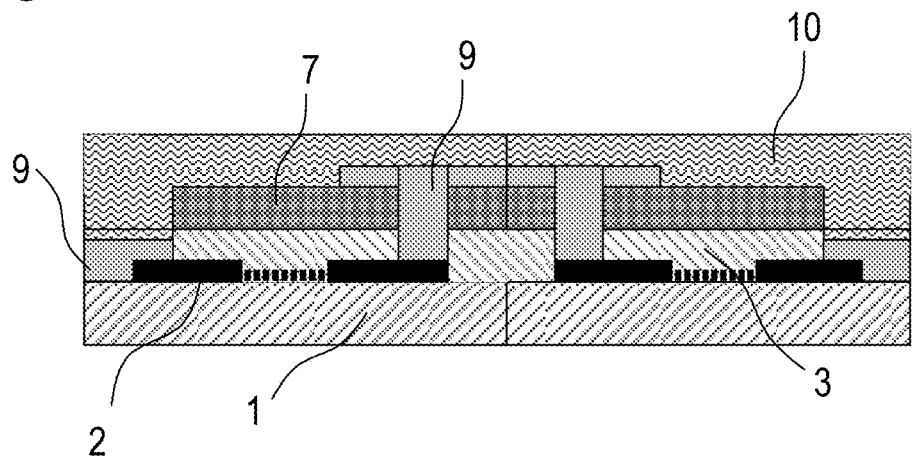
FIG. 5 shows a schematic illustration of a further embodiment of the electric component.

FIG. 5 shows the schematic illustration of an embodiment of an electric component, which could arise, for example, by the combination of two components of identical type. For this purpose, one component was turned and joined together with the first component by way of the corresponding areas.

The component thus produced comprises a substrate 1, on which two structured electrically conductive layers 2 are present. An electrically nonconductive layer 3 is applied on the electrically conductive layers 2. Partial regions of the two electrically conductive layers 2 are connected to one another via a contact layer 9. A dielectric layer 7 is situated on the electrically nonconductive layer 3. The electric component is provided with an electrically insulating covering layer 10.

In a further method variant, the base metallization 5 is structured before the layer is thickened. In this case, the base metallization 5 can be removed in partial regions. This has the advantage that no or only a thinner thickened metallic layer 6 is formed at these locations. This in turn has the advantage that now the thick metallic layer 6 need not be structured. Consequently, in a simple manner, by way of example, contact holes can be provided or it is also possible that, at locations at which singulation is intended to take place subsequently, the metallic layer 6 and the dielectric layer 7 arising therefrom are not actually produced at all. A further advantage afforded by this method is that, on account of the continuous thick metallic layer 6 being absent, fewer strains occur. In this case, the base metallization 5 can also be structured by means of methods that do not involve a high resolution, such as contact exposure, for example.

A method variant is also conceivable in which a first base metallization 5 is applied, which is then thickened to form a metallic layer 6 by means of an electrolytic method, for example. Afterward, a second base metallization 5 is applied and it, too, is in turn thickened to form a metallic layer 6. Afterward, both metallic layers 6 can then be oxidized in one method step. A method variant is likewise conceivable in which firstly a first metallic layer 6 is generated by means of a thickening method, the layer is then oxidized, a second metallic layer 6 is generated on the first oxidized layer, and the second metallic layer is then likewise oxidized in a second oxidation step.

In the case of electronic components which operate with bulk acoustic waves, the layer thickness of the dielectric layer is preferably thicker than half the wavelength of the bulk acoustic wave. In some embodiments, it is preferably even thicker than the wavelength. With the methods described above it is possible, for example, to produce dielectric layers 7 with a layer thickness of 1 to 30 µm.

The dielectric layer 7 produced according to one of the methods described above is suitable, for example, for use in radiofrequency technology. The methods are suitable, for example, for the production of GBAW components, capacitances, coils, resistors or else lines. Furthermore, a use, for example, for the production of switches, semiconductor components or else components which operate with surface waves is also conceivable. In the case of the GBAW components, the waveguiding can be effected by means of the layer sequence/layer system.

The layer forming processes when thickening the base metallization 5 can be influenced or controlled by different factors. In the case of an electrolytic method, the current density, the voltage, the choice of electrolyte, the electrolyte concentration and temperature can be mentioned here, by way of example. Furthermore, the formation of the layer thickness can be directly related to the duration of the treatment. The oxidation of aluminum, for example, can be performed in various ways. Immersion in a bath for electrolytic oxidation, passage through such a bath, purely chemical oxidation or plasma-assisted oxidation methods can be mentioned here, by way of example.

The invention is not restricted by the description of the exemplary embodiments. Rather, the invention encompasses any novel feature and also any combination of features, which in particular includes any combination of features in the patent claims, even if individual features themselves or their combination itself are not explicitly specified in the patent claims or exemplary embodiments.

What is claimed is:

1. An electroacoustic component comprising:
   a substrate configured to carry acoustic waves;
   a structured electrically conductive layer arranged directly on the substrate;
   a $SiO_2$ layer arranged directly on the structured electrically conductive layer;
   a dielectric layer arranged directly on the $SiO_2$ layer, wherein:
     the dielectric layer has at least one first region comprising $Al_2O_3$ and one or more second regions each comprising a metal; and
     the one or more second regions extend through the dielectric layer and a portion of the $SiO_2$ layer; and
   an insulating covering layer arranged directly on the dielectric layer and the $SiO_2$ layer, wherein the insulating covering layer comprises a material different from $Al_2O_3$.

2. The electroacoustic component according to claim 1, wherein the electroacoustic component operates with guided bulk acoustic waves.

3. The electroacoustic component according to claim 1, wherein the substrate is configured to carry a guided bulk acoustic wave having a wavelength, and wherein the first region of the dielectric layer is thicker than half the wavelength of the bulk acoustic wave.

4. The electroacoustic component according to claim 1, wherein the structured electrically conductive layer comprises Cu, Ag, Au, Pt, or Ti.

5. The electroacoustic component according to claim 1, wherein the substrate comprises $LiNbO_3$ or $LiTaO_3$.

6. The electroacoustic component according to claim 1, wherein the dielectric layer has a thickness of 1 µm to 30 µm.

7. An electroacoustic component comprising:
   a substrate comprising $LiNbO_3$ or $LiTaO_3$;
   an electrically conductive layer arranged directly on the substrate, wherein the electrically conductive layer is structured to form an electroacoustic transducer;
   a $SiO_2$ layer arranged directly on the electrically conductive layer and the substrate;
   a dielectric layer arranged directly on the $SiO_2$ layer, wherein:
     the dielectric layer comprises a plurality of first regions each comprising aluminum oxide, and a plurality of second regions each comprising a metal;
     the plurality of second regions extend through the dielectric layer and a portion of the $SiO_2$ layer; and
     the substrate, the electrically conductive layer and the dielectric layer each comprise a part of a guided bulk acoustic wave device;
   an electrically conductive Al layer arranged directly on the dielectric layer, wherein the electrically conductive Al layer is connected to the electrically conductive layer via the plurality of second regions of the dielectric layer; and
   an insulating covering layer arranged directly on the dielectric layer, the $SiO_2$ layer and the electrically conductive Al layer, wherein the insulating covering layer comprises a material different from aluminum oxide.

8. The electroacoustic component according to claim 7, wherein the $SiO_2$ layer is thicker than half a wavelength of a bulk acoustic wave of the guided bulk acoustic wave device.

9. The electroacoustic component according to claim 7, wherein the electrically conductive layer further comprises Cu, Ag, Au, Pt, or Ti.

10. The electroacoustic component according to claim 7, wherein the dielectric layer has a layer thickness of 1 µm to 30 µm.

11. An electroacoustic component comprising:
    a substrate configured to carry acoustic waves;
    a structured electrically conductive layer arranged directly on the substrate;
    a $SiO_2$ layer arranged directly on the structured electrically conductive layer;
    a dielectric layer arranged directly on the $SiO_2$ layer, wherein:
      the dielectric layer has a first region comprising $Al_2O_3$ and a plurality of second regions comprising a metal; and
      the plurality of second regions extend through the dielectric layer and a portion of the $SiO_2$ layer;
    electrical contacts connecting the structured electrically conductive layer through the $SiO_2$ layer and the plurality of second regions of the dielectric layer to a contact outside of the electroacoustic component; and
    an insulating covering layer arranged directly on the dielectric layer, wherein the insulating covering layer comprises a material different from $Al_2O_3$.

12. The electroacoustic component according to claim 11, wherein the substrate is configured to carry a guided bulk acoustic wave having a wavelength, and wherein the dielectric layer is thicker than half the wavelength of the bulk acoustic wave.

13. The electroacoustic component according to claim 11, wherein the structured electrically conductive layer comprises Cu, Ag, Au, Pt, or Ti.

14. The electroacoustic component according to claim 11, wherein the dielectric layer has a thickness of 1 µm to 30 µm.

15. The electroacoustic component according to claim 11, wherein the substrate comprises $LiNbO_3$ or $LiTaO_3$.

* * * * *